(12) United States Patent
Ulmer et al.

(10) Patent No.: US 9,452,630 B2
(45) Date of Patent: Sep. 27, 2016

(54) PRINTED INK STRUCTURE USING FLUOROPOLYMER TEMPLATE

(71) Applicant: Sharp Laboratories of America, Inc., Camas, WA (US)

(72) Inventors: Kurt Ulmer, Vancouver, WA (US); Kanan Puntambekar, Chicago, IL (US); Lisa Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 318 days.

(21) Appl. No.: 14/305,023

(22) Filed: Jun. 16, 2014

(65) Prior Publication Data

US 2014/0290513 A1    Oct. 2, 2014

Related U.S. Application Data

(62) Division of application No. 13/432,855, filed on Mar. 28, 2012, now Pat. No. 8,765,224.

(51) Int. Cl.
| | | |
|---|---|---|
| *B41N 1/00* | (2006.01) | |
| *H05K 3/12* | (2006.01) | |
| *H01L 51/00* | (2006.01) | |

(52) U.S. Cl.
CPC ............... *B41N 1/00* (2013.01); *H05K 3/125* (2013.01); *H05K 3/1208* (2013.01); *H01L 51/0005* (2013.01); *H01L 51/0022* (2013.01); *H05K 2201/015* (2013.01); *H05K 2203/1173* (2013.01); *H05K 2203/1476* (2013.01)

(58) Field of Classification Search
CPC .............. B41J 2/14008; B41J 2/04511; B41J 2/04526; B41J 2/04575; B41J 2002/14411; B41J 2/0451; B41J 2/04578; B41J 2/04581; B41J 2002/14322; B41J 2002/14354; B41J 2/04541; B41J 2/0458; B41J 2/14314; B41J 2/1606; B41J 2/1612; B41J 2/1628; B41J 2/1629; B41J 2/1631; B41J 2/1632; B41C 1/10; B41C 1/1008; B41C 1/1016; B41C 1/1025; B41C 1/1041; B05D 3/0254; B05D 3/0473; B05D 3/067; B05D 3/068; B05D 3/12; B05D 5/02; B05D 7/06; B05D 7/56
USPC ........................................ 427/256, 265, 286
See application file for complete search history.

(56) References Cited

U.S. PATENT DOCUMENTS

2006/0084206 A1*    4/2006    Moriya ................ H05K 3/1258
                                                                          438/149

* cited by examiner

*Primary Examiner* — Xiao Zhao
(74) *Attorney, Agent, or Firm* — Gerald Maliszewski; Law Office of Gerald Maliszewski

(57) ABSTRACT

A method is provided for controlling printed ink horizontal. cross-sectional areas using fluoropolymer templates. The method initially forms a fluoropolymer template overlying a substrate. The fluoropolymer template has a horizontal first cross-sectional dimension. Then, a primary ink is printed overlying the fluoropolymer template having a horizontal second cross-sectional dimension less than the first cross-sectional dimension. In the case of a fluoropolymer line having a template length greater than a template width, where the template width is the first cross-sectional dimension, printing the primary ink entails printing a primary ink line having an ink length greater than an ink width, where the ink width is the second cross-sectional dimension. In one aspect, the method prints a plurality of primary ink layers, each primary ink layer having an ink width less than the template width. Each overlying primary ink layer can be printed prior to solvents in underlying primary ink layers evaporating.

8 Claims, 6 Drawing Sheets

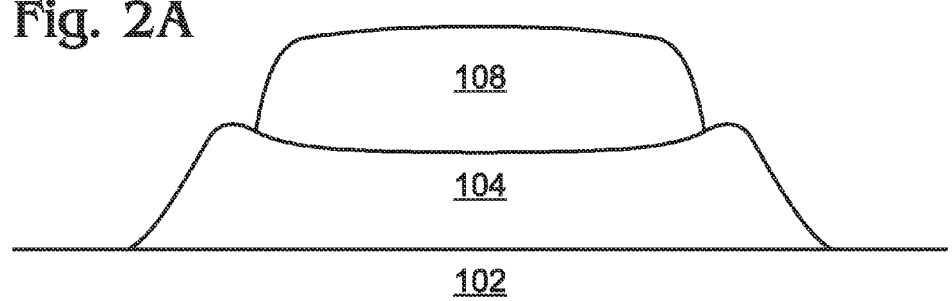
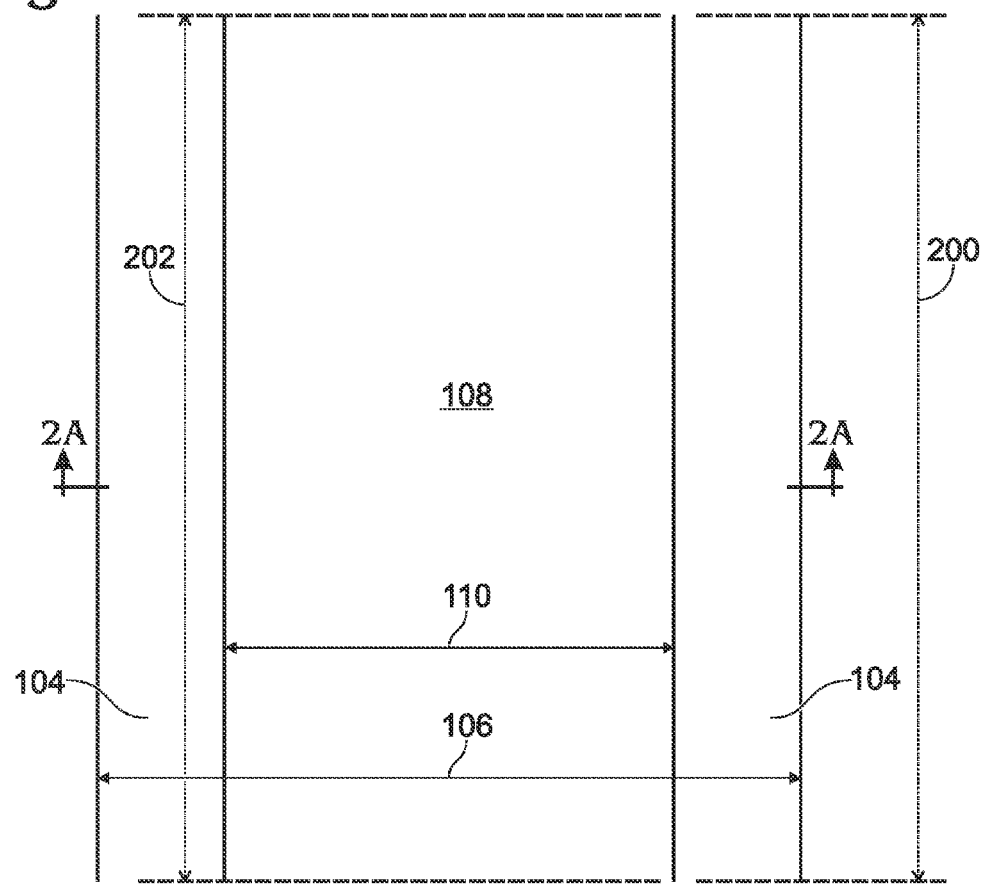

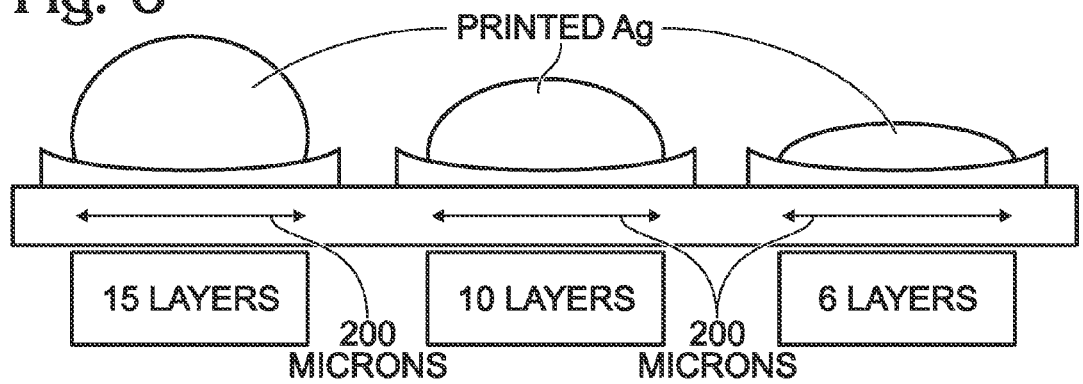
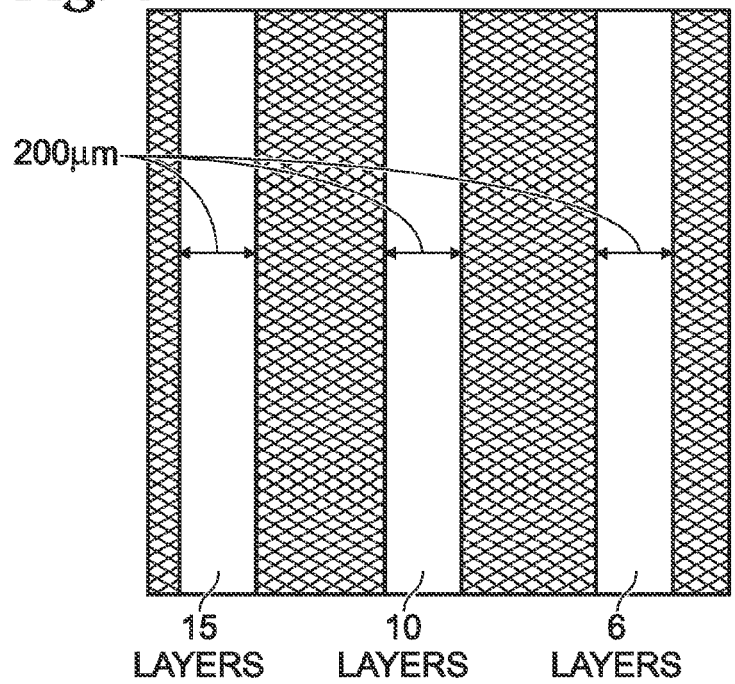

PRINTED INK STRUCTURE USING FLUOROPOLYMER TEMPLATE

RELATED APPLICATIONS

This application is a Divisional of a patent application entitled, CONTROLLED PRINTED INK LINE WIDTHS USING FLUOROPOLYMER TEMPLATES, invented by Kurt Ulmer et al., Ser. No. 13/432,855, filed Mar. 28, 2012, which is incorporated herein by reference.

BACKGROUND OF THE INVENTION

1. Field of the Invention

This invention generally relates to integrated circuit (IC) fabrication and, more particularly, to a method for controlling printed ink line widths using fluoropolymer templates.

2. Description of the Related Art

Printed electronics fabrication relies on the application of metal precursor ink formulations to produce conductive circuit elements. These metal precursor inks are applied to a substrate by inkjet printing for example, and further processing steps are required to render the printed pattern conductive. Printed metal inks, however, produce conductive lines that have conductivities that are typically on the order of 10× less conductive than bulk metals or vacuum processed thin film metal layers. This inferior conductivity is detrimental to circuit design. The conductivity limitations of these materials can be traced to density limitations due to voids and film porosity, as well as grain size and interface effects. These detrimental effects can be reduced by increasing annealing time and temperatures. However, substrate and high temperature incompatibility of other thin film layers typically constrain the annealing time/temperature conditions that are suitable. For these reasons, increasing the conductivity of printed metal lines is challenging.

One means of increasing the conductance of a printed line is by increasing the cross-sectional area of that line. This result can be achieved by increasing the width and/or the height of the line. An increase of the width of a conductive line is not typically preferred because that line will consume more substrate area and result in fewer circuits that can be physically placed on a given substrate. Increasing the height of a printed line is conventionally the method used to increase conductance. However, with solution process, and printed conductive lines in particular, this is not easily achieved. Printing thicker lines by applying more ink or printing multiple passes of ink typically results in thicker lines, but also wider lines as the ink tends to spread on the substrate.

It would be advantageous if there was a method that added significant thickness to a printed conductive line, without an increase in line width.

SUMMARY OF THE INVENTION

Disclosed herein is a method for adding significant thickness to a printed conductive line, without an increase in line width, by introducing a printed fluoropolymer bank structure. The printed line conductance is increased as a result of increasing the printed metal line thickness. Printed metal line thickness is increased without an increase in the printed metal line width by using a fluoropolymer bank structure that when fully processed is capable of limiting the lateral spread of the conductive metal precursor ink and enabling the use of larger volumes of this metal ink.

Accordingly, a method is provided for controlling printed ink horizontal cross-sectional areas using fluoropolymer templates. The method initially forms a fluoropolymer template overlying a substrate. The fluoropolymer template has a horizontal first cross-sectional dimension. Then, a primary ink is printed overlying the fluoropolymer template having a horizontal second cross-sectional dimension less than the first cross-sectional dimension. In the case of a fluoropolymer line having a template length greater than a template width, where the template width is the first cross-sectional dimension, printing the primary ink entails printing a primary ink line having an ink length greater than an ink width, where the ink width is the second cross-sectional dimension.

In one aspect, the method prints a plurality of primary ink layers, each primary ink layer having an ink width less than the template width. Advantageously, each overlying primary ink layer can be printed prior to solvents in each underlying primary ink layer evaporating. Printing the plurality of primary ink layers causes an increase in the vertical average height of the combined layer ink line following the printing of each successive primary ink layer. Further, the printing of each successive primary ink layer includes increases the average height without increasing the ink width.

Additional details of the above-described method and a printed ink structure with a controlled horizontal cross-sectional area are provided below.

BRIEF DESCRIPTION OF THE DRAWINGS

FIGS. 2A and 2B are, respectively, partial cross-sectional and plan views of a printed ink line structure.

FIG. 6 is a partial cross-sectional representation of the printed bank structures and printed metal lines produced by the methods described above.

FIG. 7 is a top down representation of an optical image of the printed metal lines described in FIG. 6.

DETAILED DESCRIPTION

Figure 1A:
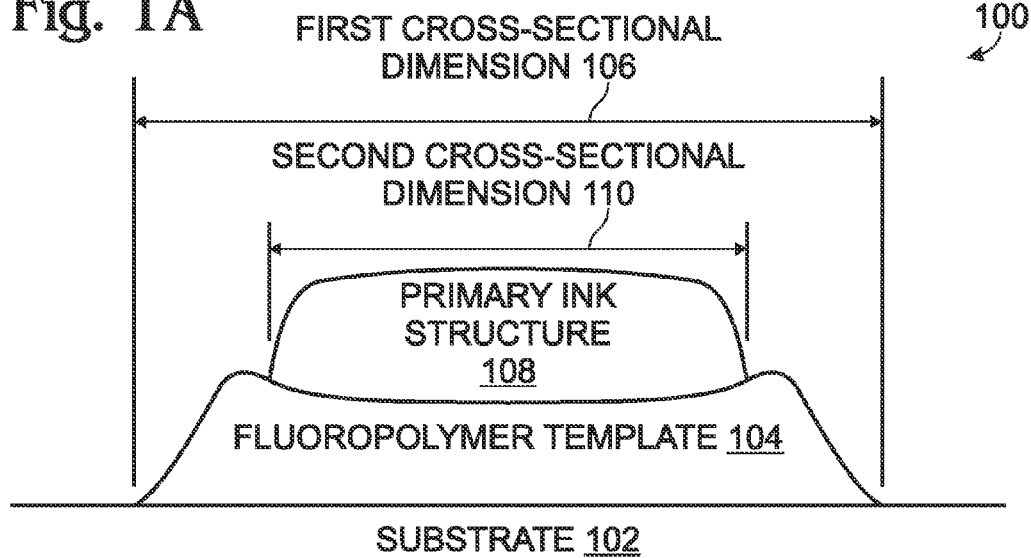
FIGS. 1A and 1B are, respectively, partial cross-sectional and plan views of a printed ink structure with a controlled horizontal cross-sectional area.
Figure 1B:
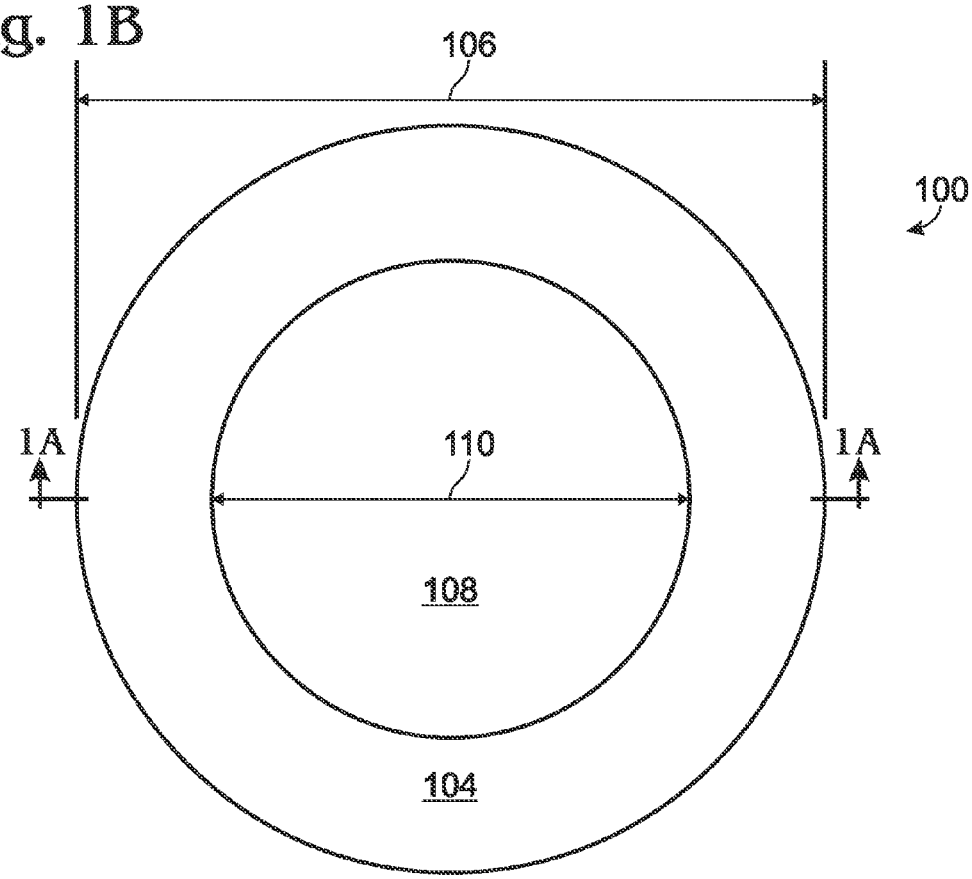

FIGS. 1A and 1B are, respectively, partial cross-sectional and plan views of a printed ink structure with a controlled horizontal cross-sectional area. The printed ink structure 100 comprises a substrate 102 and a fluoropolymer template 104 overlying the substrate 102. The fluoropolymer template 104 has a horizontal first cross-sectional dimension 106. A primary ink structure 108 overlies the fluoropolymer template and has a horizontal second cross-sectional dimension 110 less than the first cross-sectional dimension 106. in some aspects as shown, the fluoropolymer template 104 has a coffee stain pattern in the first cross-sectional dimension 106. As used herein, a coffee stain pattern is understood to a film of material with a greater thickness of material around the edge of the pattern than in the center. In other words, a coffee stain pattern resembles a pattern of spilled coffee underlying a coffee cup, after the coffee has dried. However, it should be understood that the smaller horizontal cross-sectional area of the primary ink structure is not necessarily dependent upon a coffee stain shape formed in the template 104. In some aspect, the fluoropolymer template does not have a coffee stain pattern. FIGS. 1A and 2B, as well as the drawings described below, are not necessarily drawn to scale.

FIGS. 2A and 2B are, respectively, partial cross-sectional and plan views of a printed ink line structure. In this aspect, the fluoropolymer template 104 has a template length 200 greater than a template width, where the template width is the first cross-sectional dimension 106. The primary ink structure 108 has an ink length 202 greater than an ink width, where the ink width is the second cross-sectional dimension 110.

Figure 3:
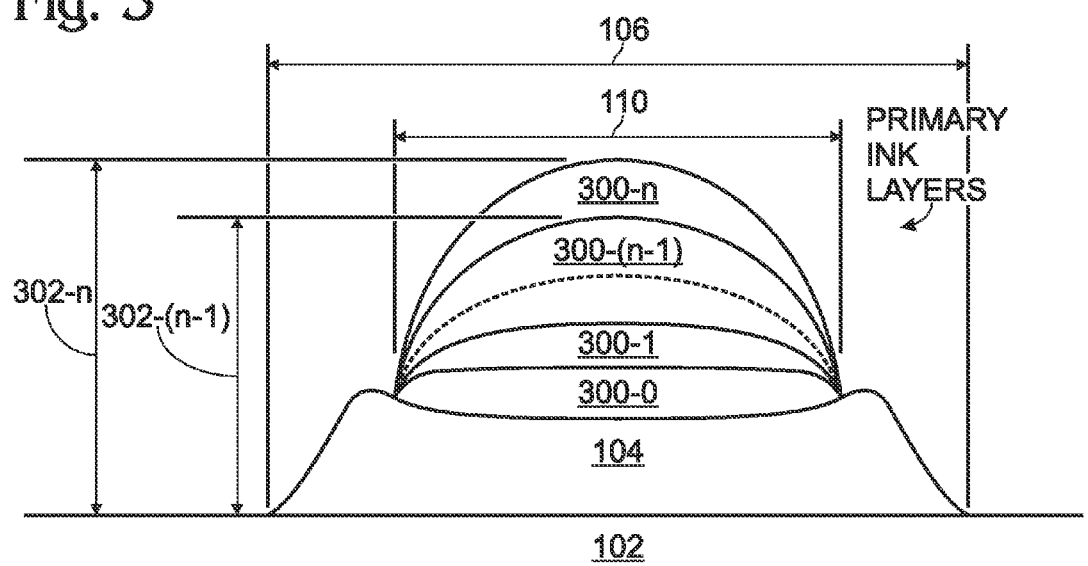
FIG. 3 is a partial cross-section view of the printed ink line structure of FIG. 2, where the primary ink line is formed from a plurality of primary ink layers.

FIG. 3 is a partial cross-section view of the printed ink line structure of FIG. 2, where the primary ink line is formed from a plurality of primary ink layers 300-0 through 300-$n$. Each primary ink layer 300 has an ink width 110 less than the template width 106. The vertical average height 302-$n$ of primary ink layer 300-$n$ is greater than the average height 302-(n–1) of primary ink layer 300-(n–1). Further, the ink width 110 of primary ink layer 300-$n$ is equal to the ink width 110 of primary ink layer 300-(n–1). In some aspects, see FIG. 8, a coffee stain. pattern exists in the primary ink layers, and the coffee stain pattern in primary ink layer 300-$n$ is more pronounced than the coffee stain pattern primary ink layer 300-(n–1). If the printed ink structure is formed from conductive ink layers, then a conductive printed line structure of n conductive ink layers would have a higher electrical conductance than a conductive printed line structure of (n–1) conductive ink layers.

Functional Description

The coffee staining behavior of the printed fluoropolymer bank material is of interest, as it is that behavior that creates the high sidewalls that define the well in the hank structure that enables, with other factors, the containment of the printed metal precursor ink.

Figure 4:
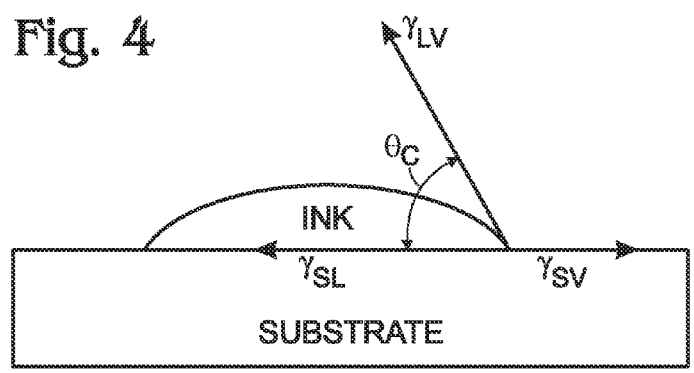
FIG. 4 depicts an ink drop formation on a substrate defined by the interaction of three interfaces.

FIG. 4 depicts an ink drop formation on a substrate defined by the interaction of three interfaces. The Evaporation Rate Distribution Theory by Deegan et al. ascribes the coffee stain pattern formation to "a form of capillary flow in which pinning of the contact line of the drying drop ensures that liquid evaporating from the edge is replenished by liquid from the interior." The evaporative flux is shown to be related to the pinned drop radius and the distance from drop center by:

$$J(r) \propto (R_f - r)^{-\lambda}; \lambda = (\pi - 2\theta_c)/(2\pi - 2\theta_c)$$

Where: $J(r)$, evaporative flux
$R_f$, final radius of dried drop
$r$, distance from center of drop
$\theta_c$, contact angle Accordingly, at contact angles $\theta_c < \pi/2$, $J(r)$ becomes large at the edge of the drying drop. With the limitation that the edge of the ink drop is pinned and that the ink drop diameter will not shrink in time, a flow of liquid is established to replenish the liquid evaporating at a relatively higher rate at the edges. Solutes are carried with the flow of solvent toward the edge and a build-up of material is observed in a typical coffee stain pattern.

Also important is the low surface tension of the fluoropolymer bank material that creates a high contact angle with the metal precursor ink. This behavior is described by Young's equation. The formation of a droplet on a solid surface is determined by the relative values of energies of the solid surface, surface tension of the liquid drop, and the interface between the liquid and the solid surface. This behavior is described by Young's Equation:

$$\gamma_{LV} \cos \theta_c = \gamma_{SV} - \gamma_{SL}$$

Figure 5A:
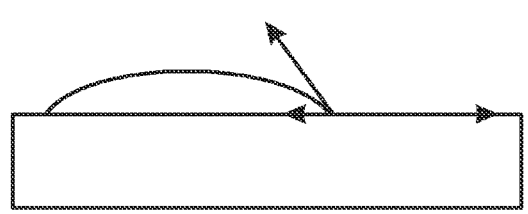
FIGS. 5A and 5B respectively depict the spread of ink on a substrate with high and low surface energy.
Figure 5B:
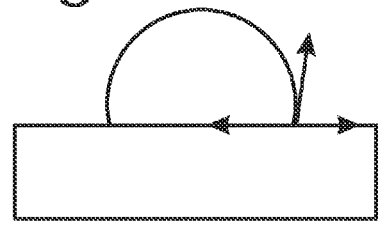

Where: $\gamma_{LV}$, surface energy of the liquid droplet
$\gamma_{SV}$, surface energy of the substrate
$\gamma_{SL}$, surface energy of the substrate/liquid interface
$\theta_c$, contact angle FIGS. 5A and 5B respectively depict the spread of ink on a substrate with high and low surface energy. A substrate with a relatively large surface energy $\gamma_{SL}$, compared to the surface tension of the ink droplet $\gamma_{LV}$ manifests itself as a significant spread of the ink droplet on the substrate (FIG. 5A). A substrate with a small surface energy will produce minimal ink droplet spread (FIG. 5B).

Thus, the fluoropolymer bank structure described above may have relatively high edges due to coffee staining of the fluoropolymer solution and a low surface tension that can be used to contain a conductive precursor ink. The amorphous fluoropolymer coating solution used in demonstration of the bank structure was AF1600 produced by DuPont. The AF1600 is diluted with the fluorosolvent FC-40 produced by 3M Corporation. AF1600 was mixed with FC-40 at a ratio of 1:5 to form a solution suitable for inkjet printing. This diluted solution was injected into an empty Dimatix inkjet cartridge. Lines of AF1600 were printed using a Dimatix 2800 DMP materials printer onto a glass substrate that had been previously coated with a polymeric dielectric coating. The printed fluoropolymer bank structures were thermally cured on a hotplate at 120° C. for 30 minutes.

The conductive ink used in demonstration was a silver nanoparticle ink formulation designated Sunjet U5603 produced by Sun Chemical Corporation. The silver ink was injected into an empty Dimatix inkjet cartridge. Lines of silver nanoparticle ink were printed using a Dimatix 2800 DMP materials printer. Multiple layers of the silver nanoparticle ink were printed consecutively to demonstrate the ability of the fluoropolymer bank structures to contain varying volumes of conductive ink. All lines of ink were printed before thermal processing. The printed silver nanoparticle lines were thermally cured on a hotplate at 120° C. for 30 minutes.

FIG. 6 is a partial cross-sectional representation of the printed bank structures and printed metal lines produced by the methods described above. The bank structures as printed were approximately 200 microns (µm) wide and exhibited the coffee staining effect of drying inks that manifested itself in the case of printed lines as peaked structures at both outer edges of the line. These peaks were measured to be about 100 nanometers (nm) in height. This peak structure and the high contact angle of the fluoropolymer bank material acted to contain the silver nanoparticle ink that was subsequently printed into the well of the bank structure. 6, 10, and 15 layers of silver nanoparticle ink were printed into the fluoropolymer bank structures. These layers of ink were sequentially printed such that approximately 10 seconds elapsed between each print. At this timescale, the solvent content of the ink from the previous layers did not have time to fully evaporate before a subsequent layer was added. Only at the end of all printing were the printed silver lines subjected to a thermal cure step that evaporated the solvents and sintered the silver nanoparticles together to form a conductive silver line. It can be seen that despite the difference in the number of layers, the lines have the same width of 200 microns.

FIG. 7 is a top down representation of an optical image of the printed metal lines described in FIG. 6. The line of the left side of the image was produced by printing 15 layers of silver nanoparticle ink into a fluoropolymer bank structure. The line in the middle of the image was produced by printing 10 layers of silver nanoparticle ink, and 6 layers of silver nanoparticle ink in the line at the right side of the image. Each line has the same width; 200 µm. This width is determined by width of the bank structure, the spread of the silver nanoparticle ink on the fluoropolymer material, and the bank structure's ability to limit that spread.

Figure 8:
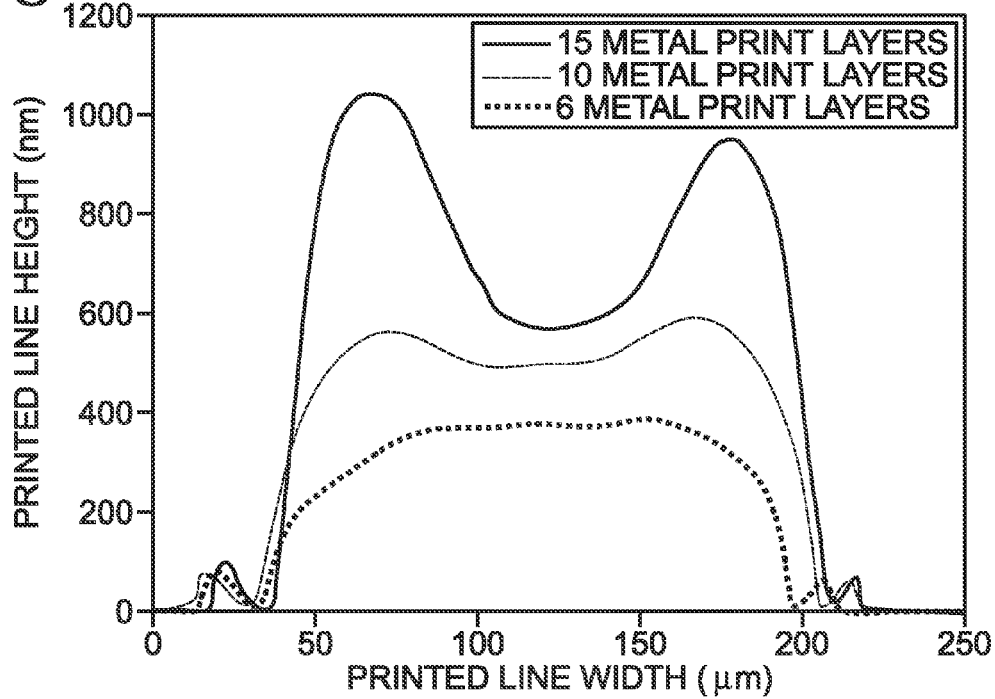
FIG. 8 is a diagram depicting printed metal line thickness profile measurements made with a Tencor stylus profilometer.

FIG. 8 is a diagram depicting printed metal line thickness profile measurements made with a Tencor stylus profilometer. The widths of the printed lines are the same in the cases of the 15, 10, and 6 layer printed lines and corroborate the measurements taken by optical microscopy. The thickness of the printed lines increases with an increase in the number of printed layers. The coffee staining behavior of the printed metal precursor ink itself is observed to be more pronounced with an increase in the number of printed layers.

Figure 9:
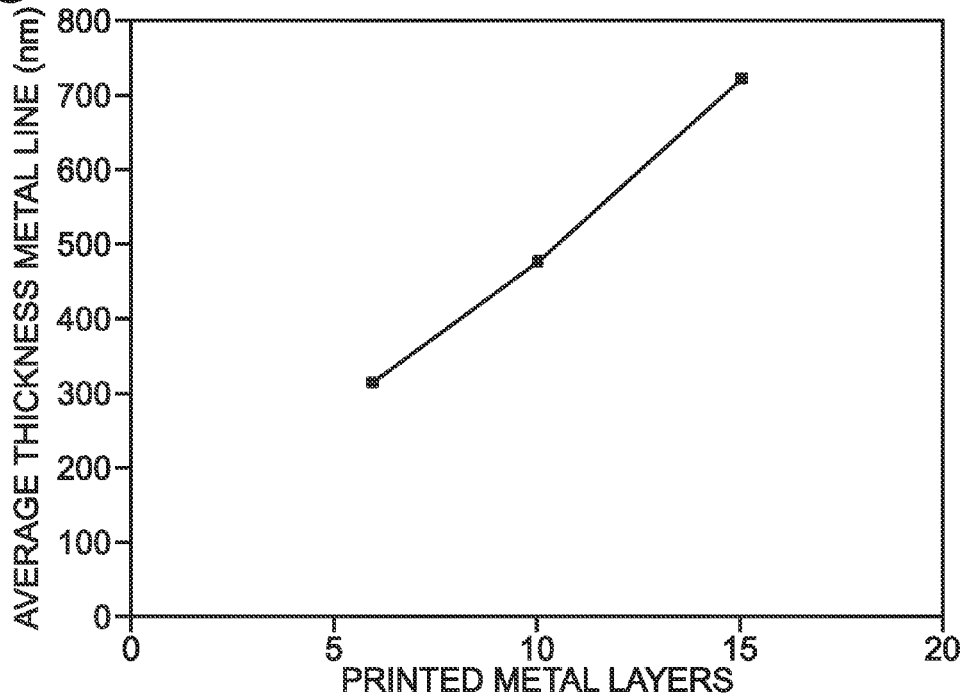
FIG. 9 is a graph depicting the average line thickness for each of the profiles of FIG. 8, as determined by stylus profilometry.

FIG. 9 is a graph depicting the average line thickness for each of the profiles of FIG. 8, as determined by stylus profilometry. A thickness increase in excess of 2× is observed between the 6 layer and 15 layer print conditions. This confirms that the thickness of a printed metal line can be increased without lateral spread of the printed line by incorporation of a fluoropolymer bank structure.

Figure 10:
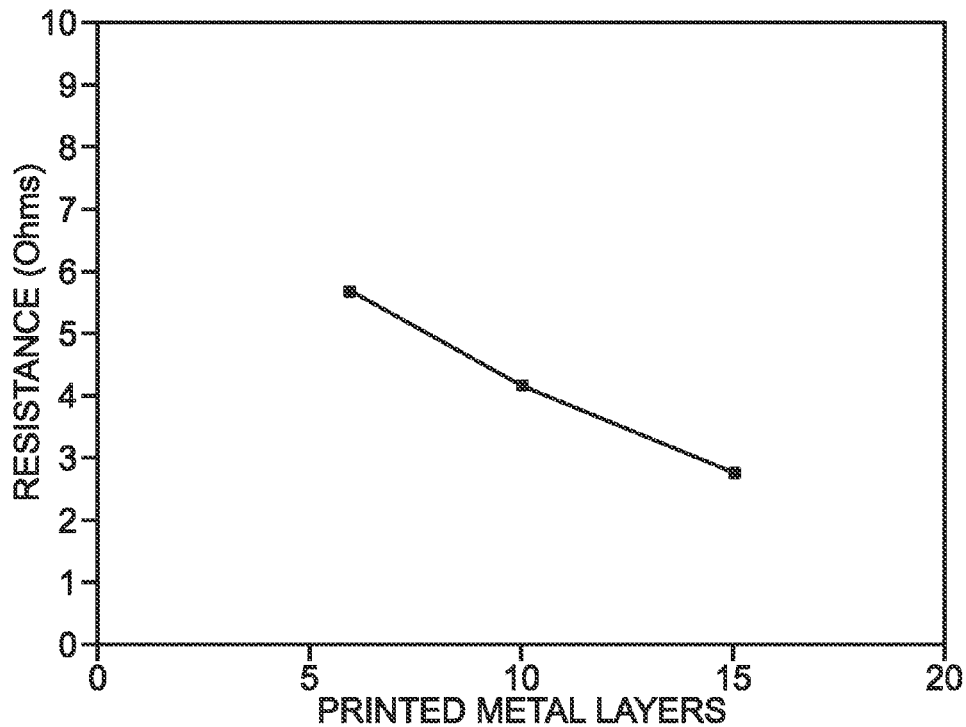
FIG. 10 is a graph depicting electrical resistance as measured by a 2-point probe technique for 6, 10, and 15 print layers of silver

FIG. 10 is a graph depicting electrical resistance as measured by a 2-point probe technique for 6, 10, and 15 print layers of silver nanoparticle ink. Measured resistance is confirmed to decrease with an increase in the number of printed metal layers. This confirms that the conductance of the printed metal line can be increased by increasing the printed line thickness without lateral spread of the printed line by incorporation of a fluoropolymer bank structure.

Additionally, several silver lines were printed outside of the bank structure to highlight the ability of the bank structures to control the print width. Lines having 1, 2, and 3 layers of silver nanoparticle ink were printed and cured in the same manner as previously described. A representational width of each line was measured by profilometry. The widths of the 1, 2, and 3 layer printed silver lines were 97 µm, 110 µm, and 121 µm respectively. As expected, the width of the printed silver lines increases with an increase in printed ink volume without the presence of the fluoropolymer bank structure.

Thus, it has been demonstrated that the coffee stain structure of a fluoropolymer bank material can be utilized to fully contain printed silver lines of equal width and various heights.

Figure 11:
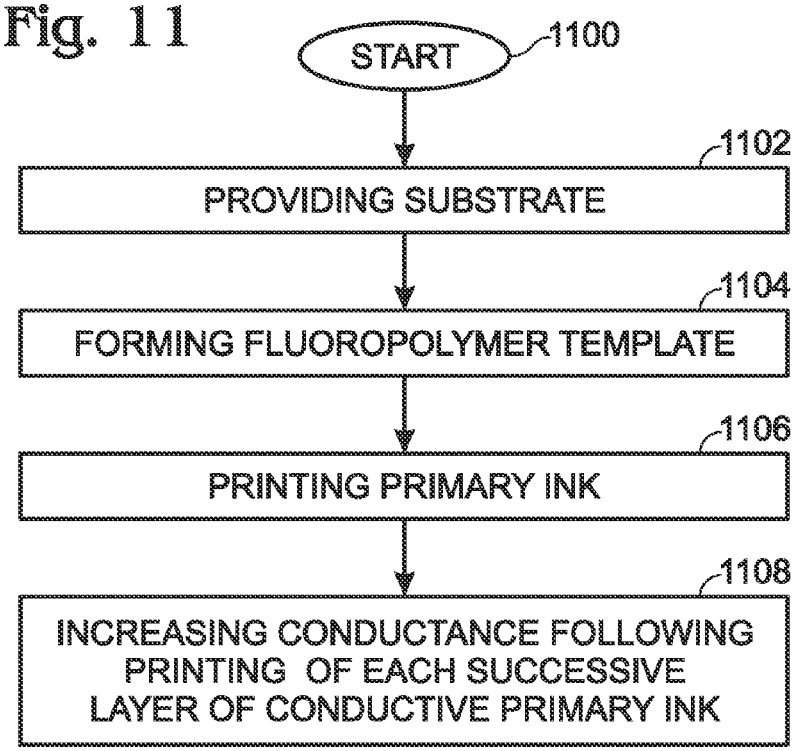
FIG. 11 is a flowchart illustrating a method for controlling printed ink horizontal cross-sectional areas using fluoropolymer templates.

FIG. 11 is a flowchart illustrating a method for controlling printed ink horizontal cross-sectional areas using fluoropolymer templates. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1100.

Step 1102 provides a substrate. Step 1104 forms a fluoropolymer template overlying the substrate, the fluoropolymer template having a horizontal first cross-sectional dimension. For example, Step 1104 may form a fluoropolymer template having a coffee stain pattern in the first cross-sectional dimension. In another aspect, the fluoropolymer template has a water contact angle of greater than or equal to 90 degrees. Step 1106 prints a primary ink overlying the fluoropolymer template having a horizontal second cross-sectional dimension less than the first cross-sectional dimension. In one aspect, forming the fluoropolymer template in Step 1104 includes forming a fluoropolymer line having a template length greater than a template width, where the template width is the first cross-sectional dimension. Then, printing the primary ink in Step 1106 includes printing a primary ink line having an ink length greater than an ink width, where the ink width is the second cross-sectional dimension.

In one aspect, printing the primary ink line in Step 1106 includes printing a plurality of primary ink layers, each primary ink layer having an ink width less than the template width. In another aspect, Step 1106 prints each overlying primary ink layer prior to solvents in each underlying primary ink layer evaporating. In yet another aspect, Step 1106 increases the vertical average height of a combined layer ink line following the printing of each successive primary ink layer. Further, the average height is increased without increasing the ink width. In one aspect, increasing the average height of the combined layer ink line following the printing of each successive primary ink layer includes creating an increasing more pronounced coffee stain pattern in the ink width cross-section following the printing of each successive primary ink layer.

In one variation, Step 1106 prints a plurality of primary ink lines including electrically conductive particles. Step 1108 increases the overall electrical conductance of the combined layer ink line following the printing of each successive primary ink layer. In this aspect, Step 1104 may form a fluoropolymer line having a template width of 3 microns or less.

In one aspect, forming the fluoropolymer template overlying the substrate in Step 1104 includes forming a fluoropolymer template having a surface energy. Then, printing the primary ink having the second cross-sectional dimension in Step 1106 includes the second cross-sectional dimension being responsive to the fluoropolymer template surface energy.

A printed ink structure has been provided with a method for controlling the widths of printed line structures. Examples of particular material and process steps have been presented to illustrate the invention. However, the invention is not limited to merely these examples. Other variations and embodiments of the invention will occur to those skilled in the art.

We claim:

1. A printed ink structure with a controlled horizontal cross-sectional area, the printed ink structure comprising:
   a substrate;
   a fluoropolymer template overlying the substrate, the fluoropolymer template having a horizontal first cross-sectional dimension with a concave top surface; and,
   a primary ink structure overlying the fluoropolymer template having a horizontal second cross-sectional dimension less than the first cross-sectional dimension.

2. The printed ink structure of claim 1 wherein the fluoropolymer template has a template length greater than a template width, and where the template width is the first cross-sectional dimension; and,
   wherein the primary ink structure has an ink length greater than an ink width, and where the ink width is the second cross-sectional dimension.

3. The printed ink structure of claim 2 wherein the primary ink line is formed from a plurality of primary ink layers, each primary ink layer having an ink width less than the template width.

4. The printed ink structure of claim 3 wherein a vertical average height of an (n+1)th primary ink layer is greater than the average height of an nth primary ink layer.

5. The printed ink structure of claim 4 wherein the ink width of the (n+1)th primary ink layer is equal to the ink width of the nth primary ink layer.

6. The printed ink structure of claim 4 wherein a coffee stain pattern in the (n+1)th primary ink layer is more pronounced than the coffee stain pattern in the nth primary ink layer, where a coffee stain pattern is defined as a layer having vertical zero thickness edges, bank structures between the zero thickness edges having a vertical bank thickness, and a well between the bank structures having a vertical well thickness less than the bank thickness and greater than the zero thickness.

7. The printed ink structure of claim 3 wherein a first primary ink structure with (n+1) conductive ink layers has a higher electrical conductance than a second primary ink structure with n conductive ink layers.

8. The printed ink structure of claim 1 wherein the fluoropolymer template has a coffee stain pattern in the first cross-sectional dimension, where a coffee stain pattern is defined as a layer having vertical zero thickness edges, bank structures between the zero thickness edges having a vertical bank thickness, and a well between the bank structures having a vertical well thickness less than the bank thickness and greater than the zero thickness.

* * * * *